United States Patent
Moriyama et al.

(10) Patent No.: US 6,350,489 B1
(45) Date of Patent: *Feb. 26, 2002

(54) DEPOSITED-FILM FORMING PROCESS AND DEPOSITED-FILM FORMING APPARATUS

(75) Inventors: Koichiro Moriyama, Kyoto; Hiroshi Echizen, Nagahama; Masahiro Kanai, Kyoto; Hirokazu Ohtoshi; Takehito Yoshino, both of Nara; Atsushi Yasuno, Nagahama; Kohei Yoshida, Utsunomiya; Yusuke Miyamoto, Yokohama, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/768,609

(22) Filed: Dec. 18, 1996

(30) Foreign Application Priority Data

Dec. 22, 1995 (JP) ............................................... 7-350359

(51) Int. Cl.$^7$ ............................ C23C 16/54; H05H 1/24
(52) U.S. Cl. ..................... 427/255.5; 427/569; 427/578
(58) Field of Search ............................ 427/255.5, 569, 427/578

(56) References Cited

U.S. PATENT DOCUMENTS

| | | | | |
|---|---|---|---|---|
| 4,252,837 A | * | 2/1981 | Auton | 427/39 |
| 4,440,107 A | | 4/1984 | Doehler et al. | 118/718 |
| 4,485,125 A | | 11/1984 | Izu et al. | 427/74 |
| 4,724,169 A | * | 2/1988 | Keem et al. | 427/249 |
| 5,510,151 A | | 4/1996 | Matsuyama et al. | 427/509 |
| 5,523,126 A | * | 6/1996 | Sano et al. | 427/575 |
| 5,571,749 A | | 11/1996 | Matsuda et al. | 437/113 |
| 5,879,741 A | * | 3/1999 | Itoh | 427/172 |

FOREIGN PATENT DOCUMENTS

| | | |
|---|---|---|
| EP | 0298420 | 1/1989 |
| EP | 0305573 | 3/1989 |
| EP | 0660422 A3 | 2/1997 |
| JP | 2-25567 | 1/1990 |
| JP | 4-44335 | 2/1992 |
| JP | 6-280026 | 10/1994 |

* cited by examiner

*Primary Examiner*—Bret Chen
(74) *Attorney, Agent, or Firm*—Fitzpatrick, Cella, Harper & Scinto

(57) ABSTRACT

To provide a deposited-film forming process and a deposited-film forming apparatus that may cause no scratches on the film forming surface to improve yield and enable stable discharge to thereby continuously form deposited films having uniform quality and uniform thickness, deposited films are formed by lengthwise continuously transporting a belt-like substrate so as to form a part of a discharge space, wherein the substrate is transported while bringing the transverse sectional shape of the substrate which forms a part of the discharge space into a curved shape by a roller.

93 Claims, 8 Drawing Sheets

DEPOSITED-FILM FORMING PROCESS AND DEPOSITED-FILM FORMING APPARATUS

BACKGROUND OF THE INVENTION

1. Field of the Invention

This invention relates to a deposited-film forming process and a deposited-film forming apparatus. More particularly, it relates to a deposited-film forming process and a deposited-film forming apparatus in which deposited films are formed on a belt-like substrate (hereinafter, the belt-like substrate is referred to as a "web") while lengthwise continuously transporting the web in a vacuum chamber. Still more particularly, it relates to a deposited-film forming process and a deposited-film forming apparatus that are preferably applicable in a roll-to-roll system suited for the continuous formation of photovoltaic devices, i.e., solar cells.

2. Related Background Art

In recent years, generation of electricity using sunlight by making use of solar cells has attracted notice as an environmentally safe, clean system, and a variety of research and development has been made so that solar cells can be put into practical use.

In order to make solar cells practical, it is required for them (1) to have a sufficiently high photoelectric conversion efficiency, (2) to have characteristics which are stable with time and (3) to be feasible for mass production. Assuming that it is necessary for usual homes to be supplied with an electric power of about 3 kW peer household, the solar cells must have an area of about 30 m$^2$ if all the power is supplied by solar cells having a photoelectric conversion efficiency of about 10%. Thus, in order to supply the electric power necessary for 100,000 homes, the solar cells must have an area as large as 3,000,000 m$^2$.

Under such circumstances, amorphous silicon solar cells that can be produced at a lower cost than solar cells produced using single-crystal silicon attract notice. This is because material gases such as silane which may be decomposed by glow discharge so that semiconductor thin films are deposited on a relatively inexpensive substrate such as a glass or metal sheet.

Accordingly, various proposals have been made for the process and apparatus for producing amorphous silicon solar cells.

For example, U.S. Pat. No. 4,485,125 discloses a continuous plasma-assisted CVD apparatus employing a roll-to-roll system as shown in FIG. 1.

As shown in FIG. 1, in this continuous plasma-assisted CVD apparatus 1100, film forming chambers 1101 to 1106 are arranged in a straight line as viewed from the top and arranged in a catenary as viewed from the side. (FIG. 1 is a diagrammatic cross-sectional side view). As a substrate for film formation, a belt-like substrate (web) 1107 is used which has a desired width and is sufficiently long.

Inside the film forming chambers 1101 to 1106, glow discharge regions in which desired semiconductor layers are formed are provided, the regions being respectively surrounded by the web 1107 and high-frequency electrodes 1108 to 1113. The web 1107 is transported so as to be successively exposed to all the glow discharge regions.

At connecting portions between the respective film forming chambers, gates 1114 called gas gates are provided to separate the chambers by spaces. The gas gates 1114 isolate materials gases fed into adjoining film forming chambers to prevent their mutual diffusion and also allow the web to pass through them. Because of the presence of these gas gates 1114, the material gases in the desired film forming chambers are not reciprocally moved when the web 1107 is successively transported to the adjoining film forming chamber, and hence semiconductor layers with the desired conductivity types can be deposited.

U.S. Pat. No. 4,440,107 also discloses a magnet roller that supports and transports the web in each film forming chamber, and a radiation heater for the magnet roller.

The magnet roller is internally provided with a permanent magnet and magnetically hangs a web made of a ferromagnetic material. This magnetic roller is appropriately disposed, whereby the web can be transported while being supported at substantially the same plane.

The radiation heater can heat the web to the desired temperature. Upon drive of this continuous plasma-assisted CVD apparatus 1100, the web 1107 is lengthwise continuously transported, while the desired semiconductor layers are formed on the web by glow discharging, so that the semiconductor layers are superposingly formed on the web 1107 and desired semiconductor junction devices can be continuously formed. As a result, it becomes possible to mass-produce semiconductor junction devices (e.g., solar cells) with a large area. Thus, the roll-to-roll system is a process suited for the mass production of solar cells.

Meanwhile, plasma processing making use of microwaves has attracted notice. Microwaves have a high frequency and hence energy density can be made higher than when conventional radio frequency (RF) waves are used. Thus, the microwaves are suited for generating and maintaining plasma in a good efficiency.

For example, U.S. Pat. No. 5,510,151 discloses deposited-film forming process and apparatus of a roll-to-roll system employing microwave plasma-assisted CVD. Deposited films can be formed even at a low pressure when plasma is generated using microwaves. Also, active species that may cause a lowering of characteristics of deposited films can be prevented from being polymerized, so that not only deposited films having a high quality can be obtained but also powder of polysilane or the like can be kept away and also the rate of film formation can be dramatically improved, as so reported therein.

In order to mass-produce solar cells using the belt-like substrate (web) transport means comprising the roll-to-roll system, the web may be made longer and wider. When, however, it is made longer and wider, a problem may occur such that the web deforms because it is heated to a desired temperature by a heater for the substrate or heated by the supply of heat from plasma. In the case of the continuous plasma-assisted CVD apparatus employing the web transport means comprising the roll-to-roll system, the web may undergo thermal deformation. The deformed part comes into contact with opening adjuster plates for forming openings that communicate between chambers, as will be described later, so that the web may have scratches on its film forming surface to make film formation faulty at that part, to make the devices faulty at that part or to cause a break of the semiconductor junction devices at that part.

In a case where the web is transported in such a way that it forms a cover of a discharge box, the thermal deformation of the web may cause a gap between the web and other members constituting the discharge box, so that the plasma shut up in the discharge box may leak to make discharge unstable.

SUMMARY OF THE INVENTION

An object of the present invention is to solve the above problems and provide a deposited-film forming process and a deposited-film forming apparatus that enable mass production in a high yield without causing scratches on the film forming surface (i.e., surface for forming a deposited film).

Another object of the present invention is to provide a deposited-film forming process and a deposited-film forming apparatus that enable stable discharge and can continuously form deposited films having uniform quality and uniform thickness.

Still another object of the present invention is to provide a deposited-film forming process comprising continuously transporting a belt-like substrate (web) in the length direction of the substrate so as to form a part of a discharge space, and continuously forming a deposited film on the web, wherein the web is transported while bringing the transverse sectional shape of the web which forms a part of the discharge space into a curved shape as viewed crosswise with respect to the direction of transport of the web.

A further object of the present invention is to provide a deposited-film forming apparatus comprising a web which is continuously transported lengthwise, means for transporting the web so as to form a part of a discharge space, and means for continuously forming a deposited film on the web, wherein the means for transporting the web comprises a roller for bringing the transverse sectional shape of the web which forms a part of the discharge space into a curved shape as viewed crosswise with respect to the direction of transport of the web.

DESCRIPTION OF THE PREFERRED EMBODIMENTS

Figure 1:
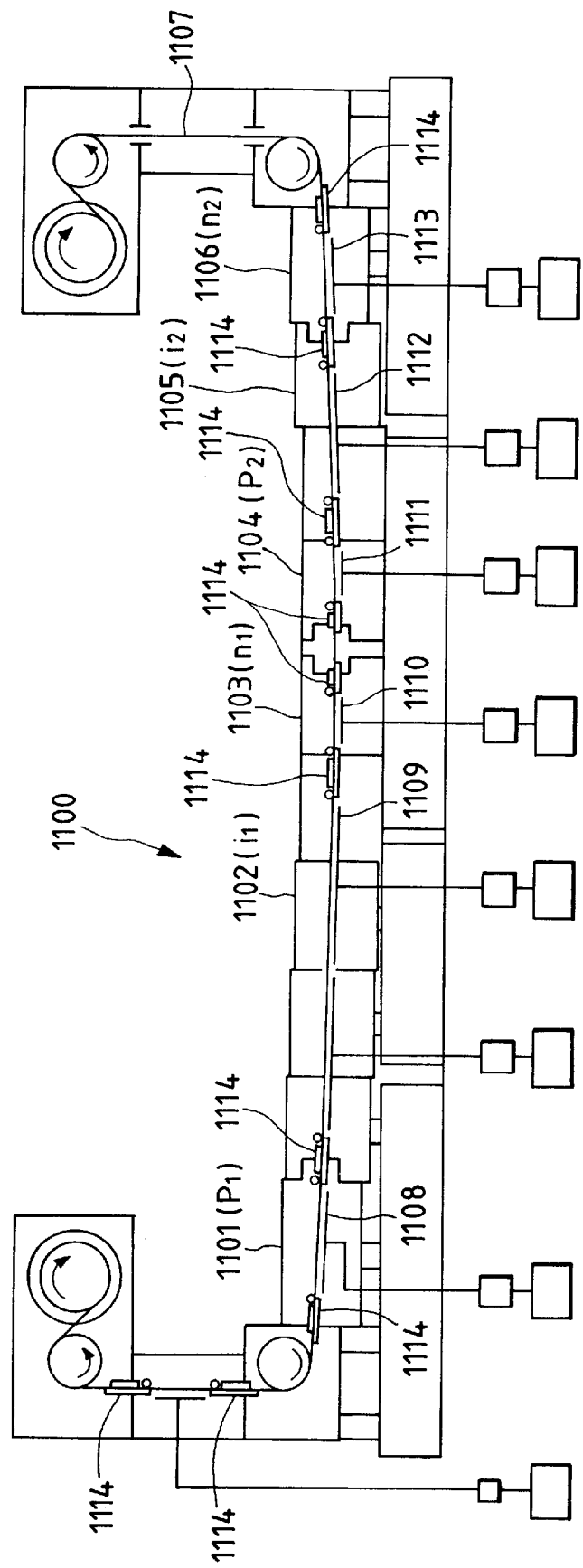
FIG. 1 is a diagrammatic cross-sectional view to illustrate an example of the constitution of a film forming apparatus.

In the present invention, to achieve the above objects, deposited films are formed while bringing into a specific shape as the transverse sectional shape of the web that forms a part of a discharge space. More specifically, the above objects can be achieved by a deposited-film forming process comprising continuously transporting a web in a length direction of the web so as to form a part of a discharge space, and continuously forming a deposited film on the web, wherein the web is transported while bringing its transverse sectional shape into a curved shape.

In the present invention, the curved shape may have either an upward convex curve or a downward convex curve, and the curve may be an oval curve or a curve having two or more points of inflection.

In the present invention, the web may be kept plane at a region other than the region where the web is transported while bringing its transverse sectional shape into the curved shape. Also, the web may be transported along the curved surface formed at the open area of the discharge space on its web transport side.

In the present invention, the deposited films may of course be formed by plasma-assisted CVD, and also the process of the present invention enables formation of semiconductor layers having achieved the above objects.

The above objects of the present invention can also be achieved by a deposited-film forming apparatus comprising a web which is lengthwise continuously transported, means for transporting the web so as to form a part of a discharge space, and means for continuously forming a deposited film on the web, wherein the means for transporting the web is provided with a roller for bringing the transverse sectional shape of the web into a curved shape.

In the deposited-film forming apparatus of the present invention, the roller may have the shape of a tsuzumi (a Japanese style hand drum, i.e., a drum with an inward curved body, or a bobbin), or a drum (a drum with an outward curved body, or a barrel), or a gourd with one or more constricted parts. The member that constitutes the discharge space has an opening made along the curved shape on the web transport side, and may be provided with a means for keeping the web plane at the part other than the opening made along the curved shape.

As described above, the present invention provides an improvement wherein the transverse sectional shape of the web that forms a part of the discharge space is brought into a curved shape so that the transverse sectional shape of the web may not change every moment during transport because of factors such as heating.

Thus, according to the present invention, the shape of the web does not vary in time sequence during transport, and hence no scratches may occur on its film forming surface or on the deposited films formed on the film forming surface to cause no lowering of yield. Further, unstable discharge can be inhibited.

The present inventors took note of the following points, and made extensive studies thereon to find out the above constitution of the present invention.

To make the studies, the continuous plasma-assisted CVD apparatus 1100 of a roll-to-roll system as shown in FIG. 1 was used.

In the apparatus 1100, the radiation heaters (hereinafter "heaters") are provided right over glow discharge regions (hereinafter "discharge spaces"; not shown) respectively provided in the film forming chambers 1101, 1102, 1103, 1104, 1105 and 1106. The heaters heat the web 1107 to the desired temperature.

In the apparatus shown in FIG. 1, the back of the film forming surface of the web 1107 is heated by the heaters when the web 1107 has been transported right over the discharge spaces. Meanwhile, the film forming surface is exposed to plasma, and heated with plasma to have a high temperature.

Figure 2:
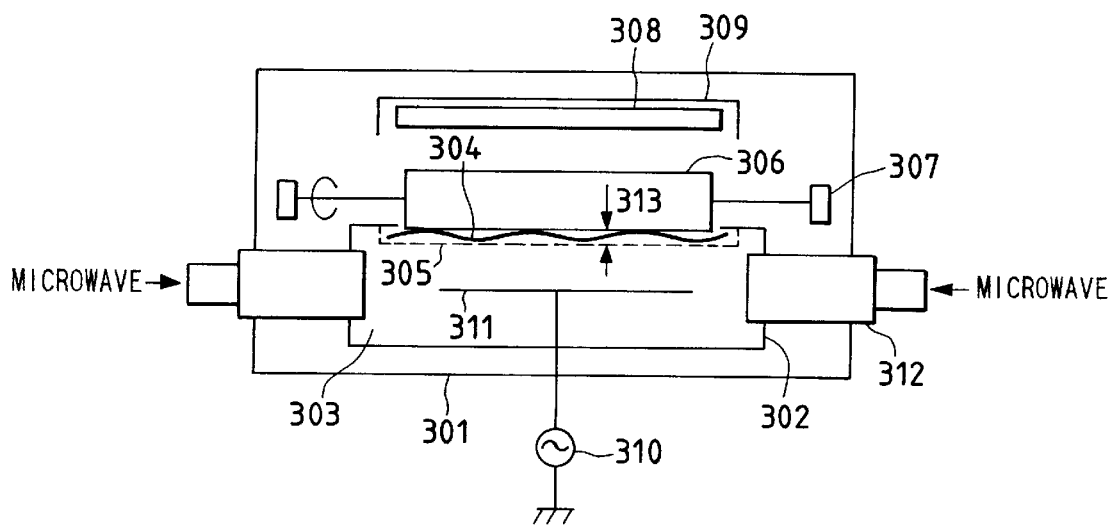
FIG. 2 is a diagrammatic cross-sectional view to illustrate a state in which the web is transported within the film forming space.
Figure 3:
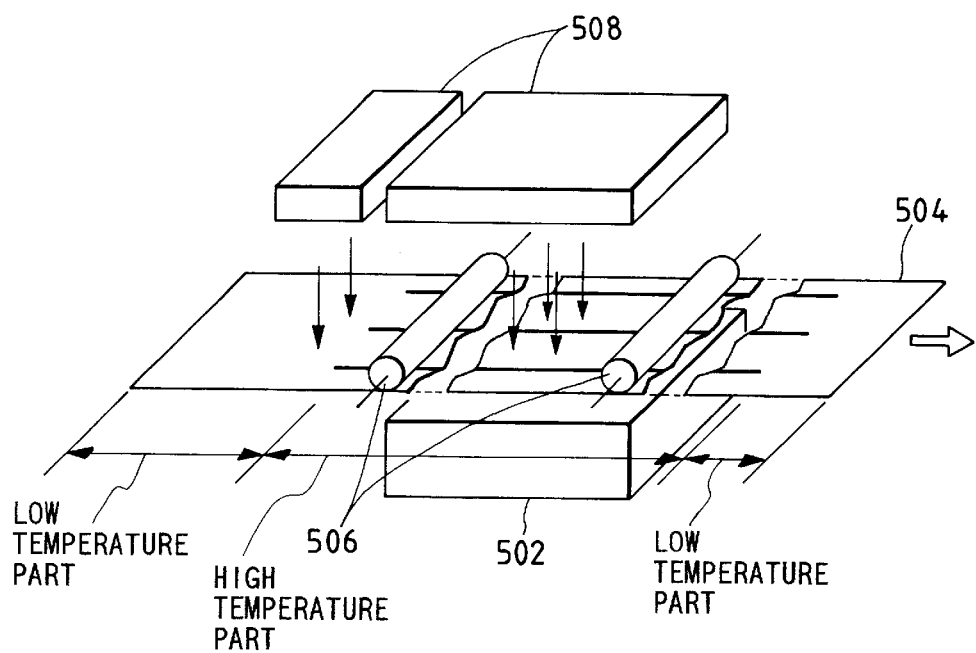
FIGS. 3 to 5 are each a diagrammatic perspective view to illustrate how the web deforms.

The present inventors have found that the shape of the web heated on the discharge space may change in the form of waves, having several peaks, like webs 304 and 504 as shown in FIGS. 2 and 3. They also found that the shape of this deformation changes with time.

An example of thermal deformation of the web will be described with reference to FIG. 2.

In the continuous plasma-assisted CVD apparatus 1100 of a roll-to-roll system as shown in FIG. 1, either RF power or microwave power can be used. This example will be described on an instance where the microwave power is used.

In FIG. 2, reference numeral 301 denotes a film forming chamber; 302, a discharge box; 303, a discharge space; 304, a web; 305, an opening adjuster plate; 306, a cylindrical magnet roller; 307, a bearing; 308, a heater; 309, a reflector; 310, an RF oscillator; 311, an antenna; 312, an applicator; and 313, a clearance. FIG. 2 is a schematic cross section as viewed on the web transport side. An instance will be described in which, e.g., a web 313 made of SUS430BA and having a width of 360 mm and a thickness of 0.125 mm is moved at a transport speed of 635 mm/min under application of a tension of 50 kg in the transport direction.

In the film forming chamber 301, a discharge box 302 with a size of 200(D)×140(H)×400(W) mm is internally provided.

The opening adjuster plate 305 is provided in the discharge box 302 on its side facing the web 304 at the web inlet side and the web outlet side each. The size of the opening adjuster plate may be changed, whereby the time for which the web is exposed to plasma can be changed to thereby obtain a film deposited on the web in a desired thickness.

The discharge space 303 has a nozzle or hole (not shown) through which film forming gases are fed into the discharge space. For example, $SiH_4$ gas, $GeH_4$ gas and $H_2$ gas are respectively fed into the discharge space at gas flow rates of $SiH_4$ 120 SCCM, $GeH_4$ 120 SCCM and $H_2$ 200 SCCM. The inside of the discharge space has a pressure of, i.e., 12.0 mmTorr.

To make the studies, microwave power with a frequency of 2.45 GHz and an output of 400 W were applied through the applicator 321 to generate plasma in the discharge space.

High-frequency waves with a frequency of 13.56 MHz and an output of 1,500 W were further applied from the RF oscillator 310 to the antenna 311 for applying RF bias power.

The web was heated by the lamp heater 308 (500 W×10 lamps in total) provided right over the discharge box so as to have a web temperature of 300° C.

The distance (clearance) 313 between the opening adjuster plate 305 and the magnet roller 306 was set to be, for example, 4 mm. The magnet roller 306 used had a cylindrical form.

Under the above conditions, amorphous silicon compound films were continuously formed on the web over a period of 5 hours.

In the course of the film formation, the shape of the web changed to wave shape in the width direction of the web when it stood right over the discharge box 302 or 502, as shown in FIG. 2 or 3. The wave of deformation was in a period of 180 mm in the width direction.

Since the clearance of the web path was 4 mm on the discharge space inlet side and outlet side each, the deformation was limited by it to have a degree of deformation of 4 mm as amplitude. However, the web at its deformation peaks came in contact with the opening adjuster plate 305 to cause deep cut scratches on the film forming surface and to break semiconductor junctions, causing a problem of what is called a shunt. This causes a great decrease in yield.

Accordingly, in order to prevent this breakage, the clearance of the web path at the discharge box was broadened to 10 mm to make the same experiments as the above. As a result, although the scratches caused by the contact of the web with the opening adjuster plate occurred less, plasma leaked outside from the discharge space through the clearance to cause a problem of unstable microwave discharge.

To avoid the above problems, a method in which the web is held between upper and lower rollers to make the web flat can be tried. However, this method has a high possibility of physically damaging the film forming surface, and is difficult to use.

In order to fundamentally solve the above problems, it was considered necessary to control the shape of the web undergoing the deformation. Accordingly, the reason why the web deforms was first studied.

In the continuous plasma-assisted CVD apparatus for continuously forming films on the web, including the apparatus of a roll-to-roll system, when the web has been transported right over the discharge spaces, the back of the film forming surface of the web is heated by the heaters and the film forming surface is heated with plasma to have a high temperature. On the other hand, when the web is transported to regions other than the region right over the discharge space, the temperature of the web drops chiefly because of radiant cooling. Hence, there are temperature differences at some regions on the web in the web transport direction. Also, the web is repeatedly heated and cooled in this way every time it is passed through a plurality of discharge spaces.

At present, such deformation or strain is presumed to be caused by the following mechanism.

In general, the high temperature part of the web has a larger web width than the low temperature part because of thermal expansion. Here, the expansion in the thickness direction is very small and is considered to be substantially negligible. Also, the expansion in the transport direction is small as compared with the long transport path, and is substantially negligible because of the expansion in the transport direction.

However, the expansion in the web width direction is considered to be a significant factor, and this is presumed to chiefly cause the deformation. A phenomenon occurring when the web expands in the width direction will be described below.

Figure 4:
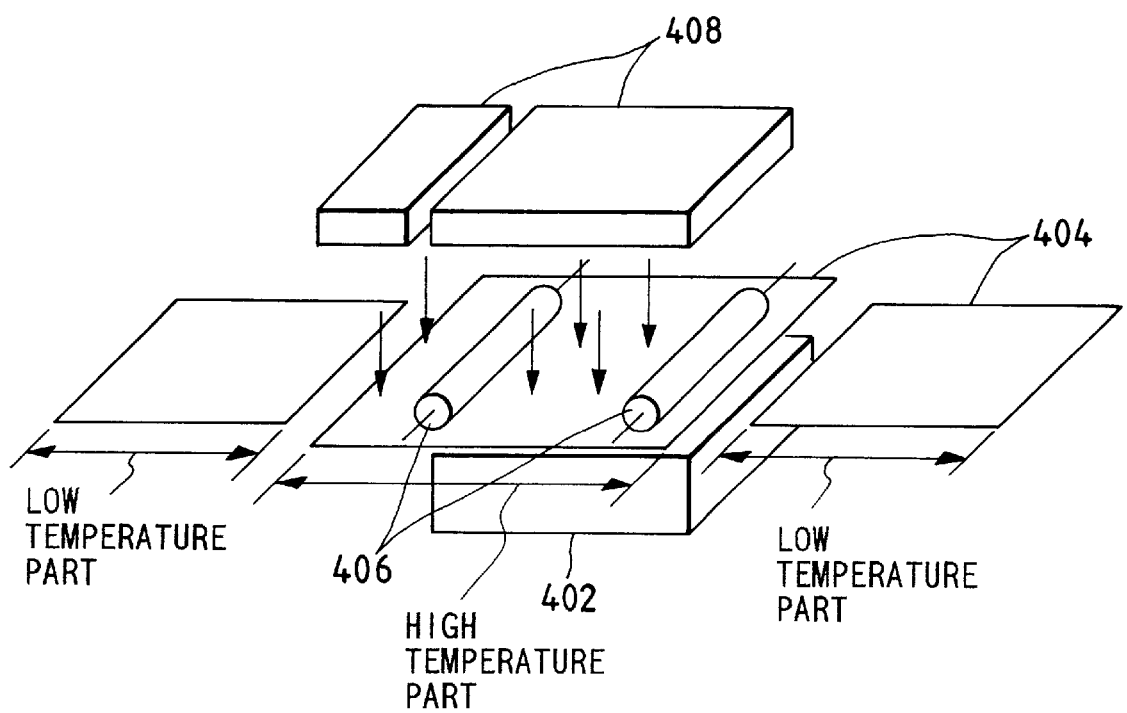

FIGS. 3 and 4 schematically illustrate instances where the web 404 or 504 continuously has the high temperature part and the low temperature part. Magnet rollers that support the web are illustrated as instances where cylindrical magnet rollers are used.

In considering the phenomenon caused by the differences in expansion in accordance with the positions of the web, it can be considered as a model in which webs with different widths are connected.

Since a tension is applied to the web in its transport direction, apparent web width as viewed from the top may hardly change. Hence, a compressive force act toward the middle of the web at the high temperature part so as to adjust the web width at the high temperature part to the web width at the low temperature part.

When compressive force or tensile force acts on a thin sheet, the thin sheet tends to strain in the direction perpendicular to the direction of the force, as known in general. Hence, the web deforms in the direction perpendicular to the web surface because of the compressive force.

The thermal expansion in the web width direction at typical film forming temperatures and the magnitude of strain caused at that time will be described by giving an example.

The matter will be considered on an instance where the web is made of SUS430 and has a width of 360 mm and a thickness of 0.125 mm at room temperature, 25° C.

Figure 5:
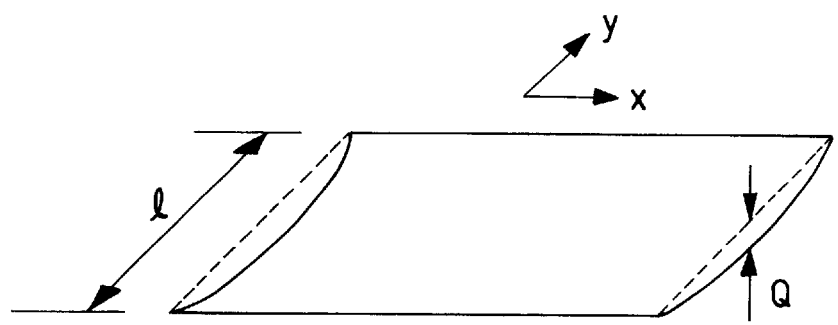

FIG. 5 diagrammatically illustrates a cross section of the web. The web has a width l of 360 mm. The transport direction is represented by x, and the width direction falling at right angles with it, by y. The shape of the web which is flat at 25° C. is shown by broken lines.

On the assumption that a web heated to expand deforms in arc when forced to have a web width of 360 mm, quantity Q of strain from a peak plane of the arc was determined to obtain the results as shown in Table 1.

TABLE 1

| Web temperature | Web width | Difference from web width at 25° C. | Strain quantity Q |
| --- | --- | --- | --- |
| 200° C. | 361.0 min | 1.0 mm | 13 mm |
| 300° C. | 361.6 min | 1.6 mm | 17 mm |

As shown in Table 1, the strain quantity Q reaches as much as 17 mm at, e.g., web temperature of 300° C., and hence the clearance on the discharge space inlet side and outlet side through which the web is passed can not be made smaller than that. In an actual apparatus where the cylindrical magnet rollers are used, the heated web has a transverse sectional shape which is neither arc nor plane, and spontaneously deforms in waves as shown in FIG. 2. In the case when the web is plane, the web comes into linear contact with the magnet rollers, and hence a strong magnetic attraction force is obtained.

However, in the case when the web is heated, as shown in FIG. 2, the peaks of the wave form only come into point contact with the cylindrical magnet rollers, and hence only a weak magnetic attraction force is obtained, resulting in a decrease in the web support effect attributable to the magnet rollers. Another problem is also seen.

The web also constitutes a part of the discharge space, and hence, in order to stably maintain microwave plasma discharge, it is preferred that the shape and size of the discharge space constituted of the discharge box and the web and the gap between the discharge space and the outside thereof are always constant. Since, however, the shape of the web is not constant in time sequence, this variation in shape damages the stability of discharge.

At present, from the viewpoints of "heat", "tension" and "web", it is considered that the reason why "the shape of the web is not constant in time sequence" can be explained as follows:

First, from the viewpoint of "heat", the heater controls temperature by controlling its output, in order to keep the web at a predetermined temperature. Since, however, the web has a small heat capacity, even a small variation in heater output causes variation in web temperature. Hence, the expansion of the web changes to cause a change in the form due to strain. Namely, there is a high possibility that the shape of the web is not constant in time sequence in view of the flow-in and flow-out of the heat.

From the viewpoint of "tension", the shape of the web is not constant in time sequence. Stated specifically, in some cases, the continuous plasma-assisted CVD apparatus is incorporated with a steering mechanism as will be described later, as a mechanism for putting a wind-up roll end in order. The tension in the width direction has a difference in magnitude between the case when the steering mechanism stands driven and the case when it stands stopped. This difference affects the shape of the web. Hence, the shape of the web is not constant in time sequence.

From the viewpoint of "web", in the case when a web with a small thickness made of, e.g., SUS stainless steel is used, the form due to strain changes because of the non-uniformity inherent in the web itself. More specifically, in the production of thin webs, it is difficult to produce webs having perfectly uniform thickness, hardness and so forth, and some variations of these characteristics may commonly occur. When such a web having even a small non-uniformity is transported in the continuous plasma-assisted CVD apparatus, the form of the above spontaneous deformation of the web may change with movement of the web.

As stated above, it has been found that the strained form of the web changes in variety with changes in web temperature, with repetition of drive and stop of the steering mechanism and with transport of the web. Thus, since the shape of the web varies in time sequence, it is difficult to prevent the opening adjuster plate from coming into contact with the web, and even when the gap is provided between them, the film forming surface is scratched to cause a decrease in yield and unstable discharge.

In the present invention, to solve the above problems, the transverse sectional shape of the web constituting a part of the discharge space is brought into a curved shape so that the web is fitted to the peripheral shape of the magnet roller according to the present invention, to thereby make the web free of any changes occurring every moment in its transverse sectional shape.

The constitution of the process and apparatus of the present invention will be described below in greater detail with reference to the drawings.

Figure 6:
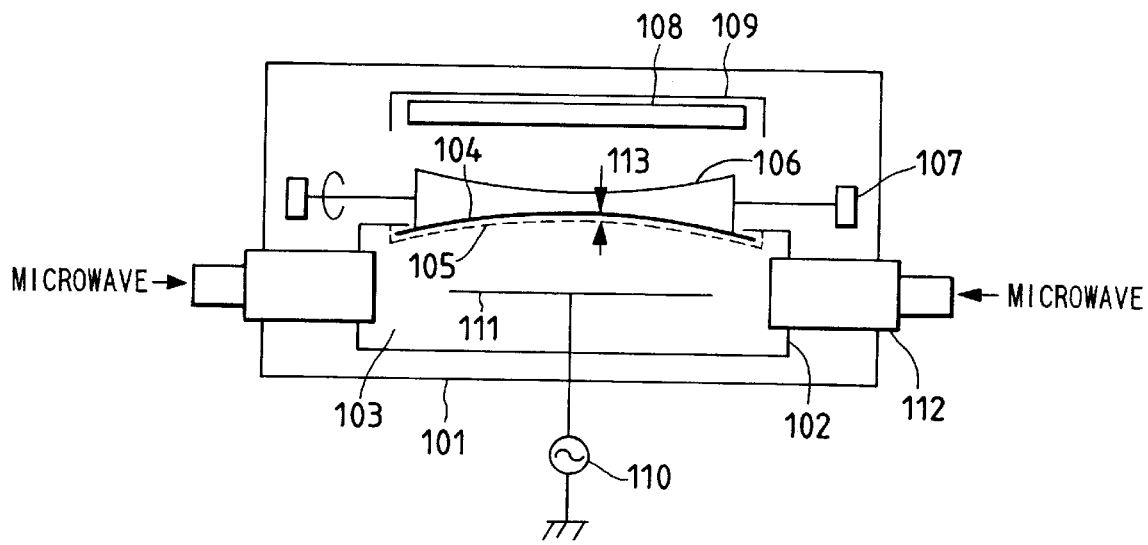
FIGS. 6 and 9 are each a diagrammatic cross-sectional view to illustrate a state in which the web is transported according to the present invention.

FIG. 6 cross-sectionally illustrates the apparatus according to the present invention. Its cross section falls at right angles with the web transport direction. In FIG. 6, reference numeral 101 denotes a film forming chamber; 102, a discharge box; 103, a discharge space; 104, a web; 105, an opening adjuster plate; 106, a hand drum (or bobbin) type magnet roller; 107, a bearing; 108, a heater; 109, a reflector; 110, an RF oscillator; 111, an antenna; 112, an applicator; and 113, a clearance. Namely, the roller 106 has a cross-sectional shape concavely curved toward the middle as its cross section along the shaft.

In FIG. 6, the film forming chamber 101 is one of three semiconductor thin-film forming chambers of a roll-to-roll type plasma-assisted CVD apparatus shown in FIG. 8, which will be detailed later, and is picked up as an example that can be preferably used in an i-type layer forming chamber 854.

In FIG. 6, the film forming chamber 101 has a vacuum retaining means, a gas feed-discharge means, a power supply means, a web heating means and a web transport means. Inside the film forming chamber 101, the discharge space 103 is defined by inner walls of the discharge box 102 and the surface of the web 104. Into this discharge space 103, desired materials gases are fed, and desired microwave power is supplied through the applicator to thereby cause glow discharge to take place and decompose the material gases. In order to improve film properties, an RF power outputted from the RF oscillator 110 is applied to the plasma through the antenna to form desired semiconductor films on the web 104.

When the semiconductor films are formed on the web 104, the web 104 is previously heated to a desired temperature by means of the heater 108.

In FIG. 6, the web 104 has a transverse sectional shape having an upward convex, oval curve. The bobbin type magnet roller 106 has also a cross section having an upward convex, oval curve (i.e., an inversely corresponding concave line) at its part coming in contact with the web 104.

The opening adjuster plate 105 has a top end also having the same shape as the oval curve so that the web 104 serving as a top cover can be transported while keeping an upward convex, curved surface.

More specifically, the discharge box 102 has substantially the shape of a rectangular solid, and its top is constituted of the opening and the opening adjuster plate. Of the four sides thereof, the two sides facing the transport direction each have the shape of a figure formed of three straight lines and one curve corresponding to the top end of the opening adjuster plate 105. The other two sides facing each other in the direction perpendicular to the former sides (i.e. the width direction) and the bottom each have the shape of a rectangular.

As shown in FIG. 6, the bobbin type magnet roller 106 is provided one by one in the vicinity of the inlet and the outlet each, of the discharge box 102. The web 104 magnetically attracted with this bobbin type magnet roller 106 is forcedly deformed by the bobbin type magnet roller 106 without regard to the web temperature to have the upward convex, curved surface.

In the present invention, the web 104 is brought into contact with the bobbin type magnet roller 106 along its periphery without regard to the web temperature, and hence the force of magnetic attraction act.

Figure 7:
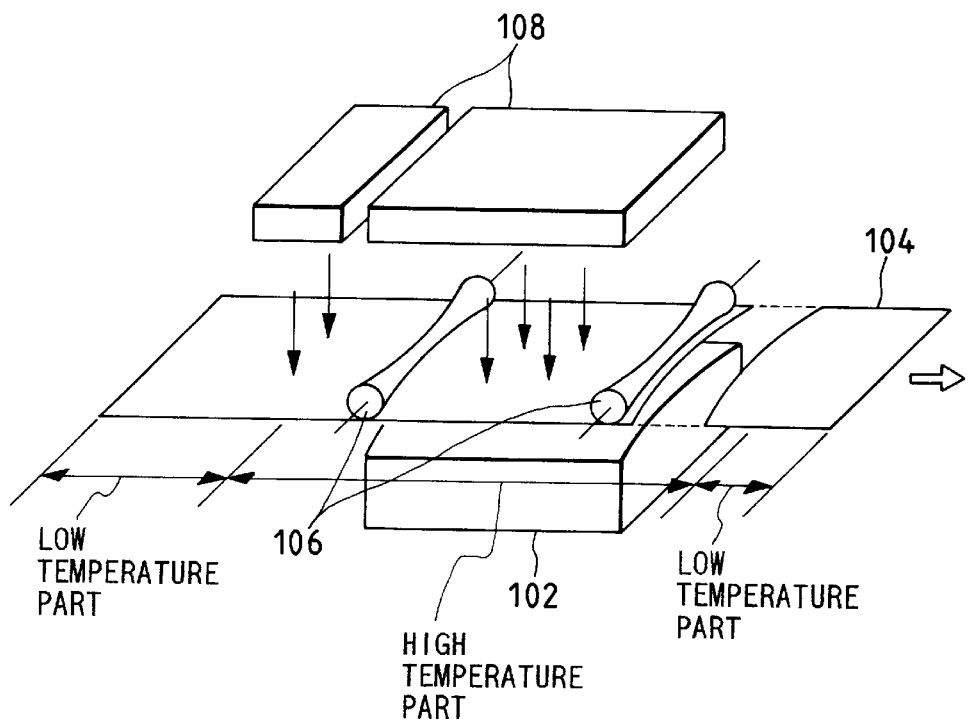
FIGS. 7 and 10 are each a diagrammatic perspective view to illustrate how the web is deformed in the present invention.

More specifically, in the apparatus of the present invention, the shape of the web 104 is changed in similar figures along the oval curve when the web 104 undergoes thermal expansion as a result of heating, and is elongated by a size corresponding to the thermal expansion coefficient. As the result, the web 104 does not the shape spontaneously deformed in waves as shown in FIG. 3, but the upward convex, curved surface as shown in FIG. 7.

In the apparatus of the present invention, the web 104 is heated neither by the plasma nor by the heater when it stands transported to the part outside the discharge box 102, and is radiantly cooled there, so that the temperature of the web 104 drops. At the part where the temperature of the web 104 has dropped, the shape of the web 104 returns to the original plane and hence the shape of the web 104 is returned to a plane by natural cooling or forced cooling before it enters into the gas gate.

In the present invention, the magnet roller is not limited to the bobbin type magnet roller 106 as described above, which brings the transverse sectional shape of the web 104 into the upward convex, overly curved line as shown in FIG. 6. The same effect as in the case of FIG. 6 can be obtained also using a drum (or barrel) type magnet roller 206 which deforms the web in a downward convex, oval curve as shown in FIG. 9, or a gourd type magnet roller which deforms the web in a curve having two or more points of inflection as shown in FIG. 10.

Figure 8:
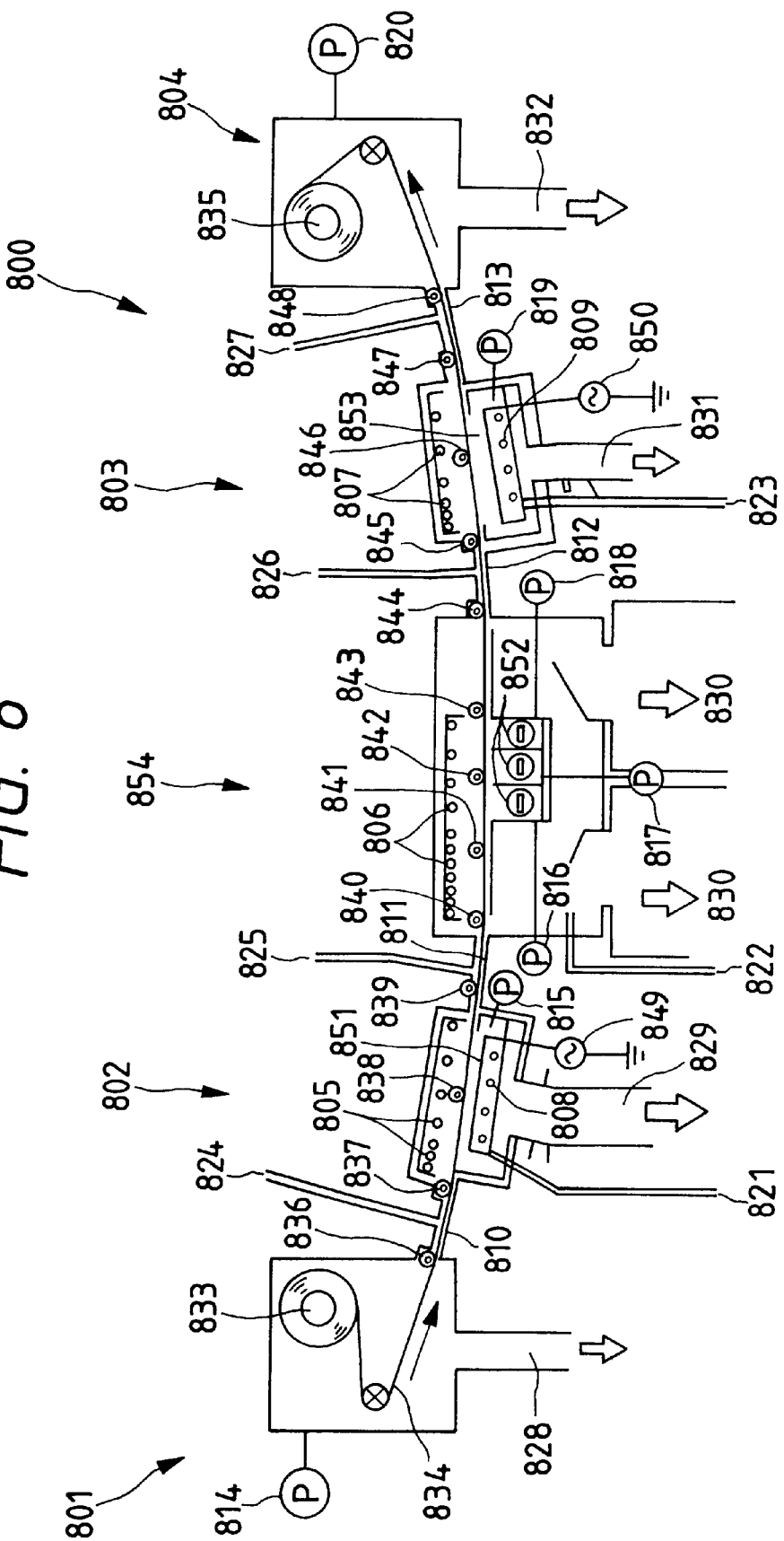
FIG. 8 is a diagrammatic cross-sectional view to illustrate a preferred example of the constitution of a film forming apparatus.
Figure 9:
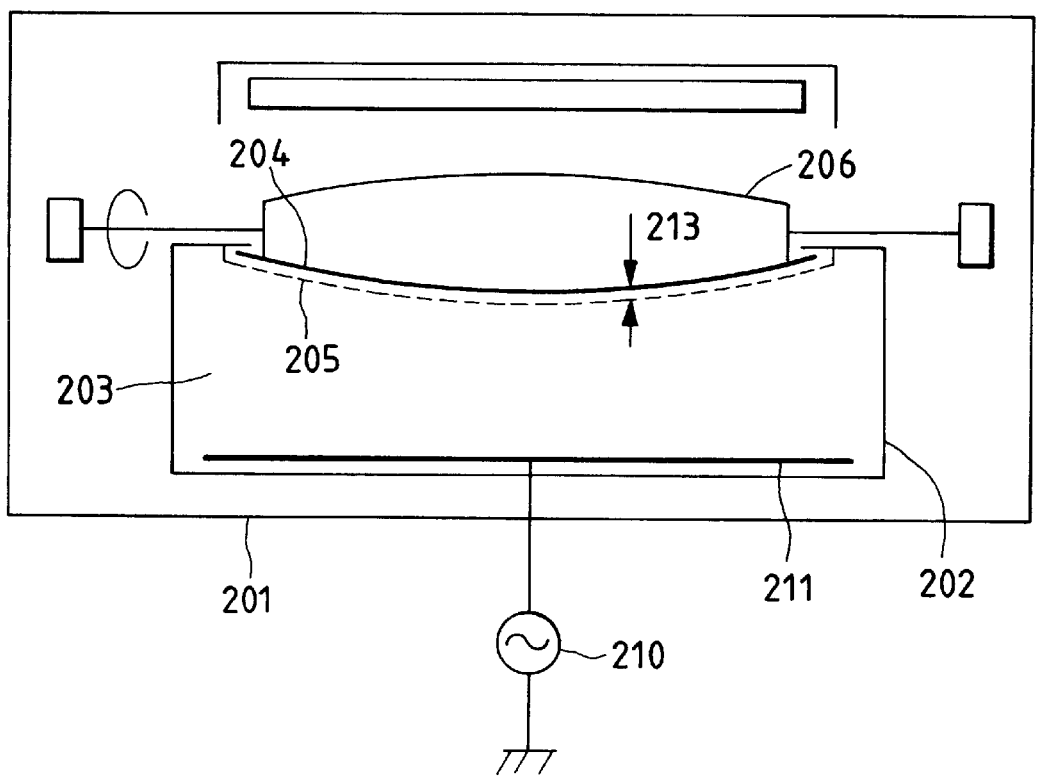
Figure 10:
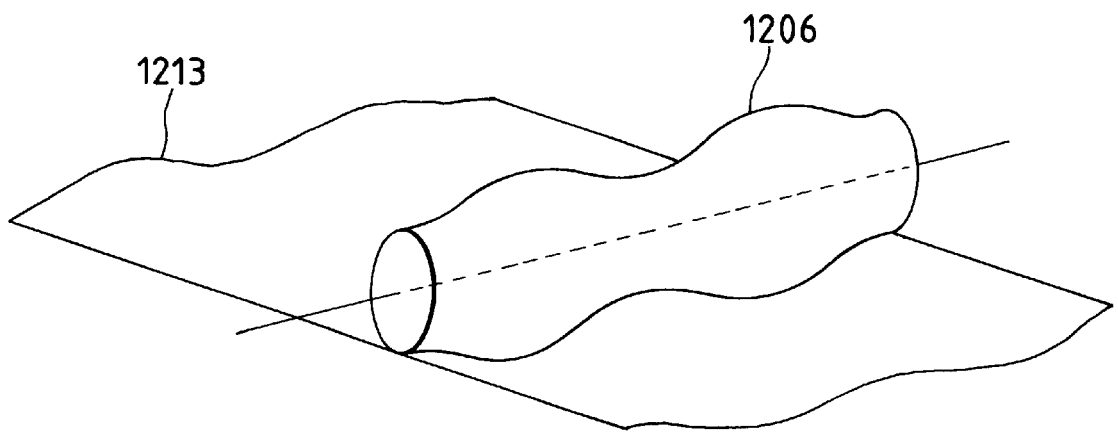

FIG. 9 is a diagrammatic cross-sectional view of an apparatus preferably usable as, e.g., a first doped layer forming chamber 802 or a second doped layer forming chamber 803 of a roll-to-roll system type plasma-assisted CVD apparatus 800 as shown in FIG. 8. While in the apparatus shown in FIG. 6 the plasma is generated using microwaves, the apparatus shown in FIG. 9 is so made up that plasma is generated using RF power.

In the apparatus shown in FIG. 9, reference numeral 201 denotes a film forming chamber; 202, a discharge box; 203, a discharge space; 204, a web; 205, an opening adjuster plate; 206, a drum (or barrel) type magnet roller; 210, an RF oscillator; 211, a discharge electrode; and 213, a clearance. Namely, the roller 206 has a cross-sectional shape convexly curved toward the middle as its cross section along the shaft.

The apparatus shown in FIG. 9 is operated in substantially the same manner as that shown in FIG. 6, except that an RF voltage is applied between the discharge electrode 211 and the web 204 to thereby cause glow discharge to take place and decompose the material gases fed into the discharge space 203. In FIG. 9, an apparatus is shown in which the barrel type magnet roller 206 is used as a magnet roller. In FIG. 9, the web 204 is magnetically attracted with this barrel type magnet roller 206 and is deformed to have the downward convex, curved surface, which is inverse to that of the apparatus shown in FIG. 6. In this instance, the shape of the web 204 is changed in similar figures along the downward convex, oval curve when the web 104 undergoes thermal expansion as a result of heating.

When a gourd type magnet roller as shown in FIG. 10 is used, the web can be forcedly deformed into a shape similar to the shape of spontaneous deformation of the web, i.e., the shape approximate to the wavy form of the web 504 shown in FIG. 3. Since the web is kept to have the shape approximate to the spontaneous deformation, the shape of the web can be stabler. In this instance, although the web is deformed in waves, the problems as previously discussed can be prevented because such a shape is under control. Moreover, the same effect can be obtained by the magnet roller having the diameter of the widest part smaller than that of the widest part of the bobbin type or barrel type magnet roller, so that the apparatus can be made smaller in size.

As a matter of course, the shape of the roller by which the web is deformed is by no means limited to those described above, and may be appropriately modified. In any case, the web transport and film formation can be made stable by making the shape of the web stable.

The shape of the roller of the i-type layer forming chamber and the shape of the roller of the doped layer forming chamber are also by no means limited to those described above.

As described above, the use of the process and apparatus constituted according to the present invention makes it possible for the web to keep a constant shape as it stands along the periphery of the magnet roller when the web is heated and transported, and hence enables an apparatus having the following three features.

(1) Since the shape of the web can be kept constant, there is no longer any possibility that the web will come in contact with the opening adjuster plate due to the variation in web shape that has occurred in the conventional apparatus, so that the film forming surface of the web can no longer be physically damaged.

(2) Since the shape of the web can be kept constant, the electrical capacity and so forth of the discharge box can be kept constant so that especially the plasma discharge making use of microwaves can be stably maintained.

(3) Since the film forming surface of the web is not scratched even when the distance, i.e., clearance between the web and the opening adjuster plate is set smaller, the clearance can be made as small as possible so that the air-tightness of the discharge box can be improved. This prevents plasma from leaking from the discharge box to enable stable maintenance of plasma discharge.

EXAMPLES

The present invention will be further described below by giving Examples, chiefly in respect of the sequential relationship of the film forming chamber 101, including the disposition of gas gates and the steering mechanism, and the plasma-assisted CVD apparatus of a roll-to-roll system.

FIG. 8 is a diagrammatic cross-sectional view to illustrate an example of the plasma-assisted CVD apparatus 800 of a roll-to-roll system according to the present invention.

In the following, an i-type semiconductor layer is simply called an i-type layer, and a doped semiconductor layer as a doped layer.

In FIG. 8, reference numeral 801 denotes a substrate wind-off chamber; 802, a first doped layer forming chamber; 803, a second doped layer forming chamber; 804, a substrate wind-up chamber; 805 to 809, temperature control mechanisms such as heaters; 810 to 813, gas gates; 814 to 820, vacuum gauges; 821 to 827, gas feed pipes; 828 to 832, gas exhaust duct; 833, a wind-off bobbin; 834, a web; 835, a wind-up bobbin; 836 to 848, magnet rollers; 849 and 850, high-frequency oscillator; 851, 852' and 853, discharge spaces; 852, an i-type layer forming chamber; and 854, a microwave inlet.

The plasma-assisted CVD apparatus 800 of a roll-to-roll system as shown in FIG. 8 is constituted chiefly of film forming chambers, material gas feed means, gas separating means, exhaust means, transport means, power supply means, and substrate temperature control means. This plasma-assisted CVD apparatus 800 of a roll-to-roll system can form semiconductor layers for single-cell of, e.g., pin-type photovoltaic devices.

As the high-frequency power led into the film forming chambers 802 and 803 in which the first and second doped layers are formed, a power with a frequency of 13.56 MHz or 100 kHz is usually used. Here, the high-frequency power sources 849 and 850 are by no means limited to those having the above frequency, and any of those of 50 kHz to 10 GHz may be used. It is, however, necessary to appropriately control film forming conditions when those with frequencies other than the foregoing are used. Especially when frequencies of 50 MHz or above are selected, pressure may preferably be set at 5 to 20 mTorr.

The microwaves led into the discharge space 852 in which the i-layer is formed may also be any of low-ripple types continuously oscillating at frequencies of microwave bands. Of course, microwaves need not necessarily be used so long as a discharge space length large enough to ensure the thickness of the i-layer can be taken.

In the present Example, a web gate is used.

The web gate is a mechanism similar to a gate valve having a square opening, used to vacuum-seal the web by interposing it up and down with elastomers. The wave gate is useful when the web is exchanged or the film forming chambers are put to maintenance care.

The wave gate is effective for preventing time efficiency of the apparatus from lowering because of opening to the atmosphere, when the apparatus has a number of film forming chambers and their maintenance care must be taken at different timing.

Stated specifically, to open the film forming chamber to the atmosphere, it is necessary to cool the discharge box, feed dry nitrogen gas and open the chamber to the atmosphere. Meanwhile, to again start film formation, it is necessary to take a different procedure of draw a vacuum, feed material gases, heat the discharge box and preliminarily form a film. Consequently, it takes 5 to 6 hours to carry out a series of these procedures.

If a series of these procedures must be carried out at different timing for each film forming chamber, any continuous integrated production can not be expected, resulting in a decrease in production yield.

This wave gate may have such a size that it structurally has an opening wider than the width of the web and allows the belt-like substrate to pass with ease.

The wave gate enables vacuum sealing at a low leakage, using conventional fluorine rubber as the elastomer so long as the web has a thickness smaller than 0.3 mm.

The elastomer is not limited to fluorine rubber. It, however, must fulfill the conditions that it has an elasticity and a low leakage, it does not break at the web end and it does not cause an increase in leakage even when the web gate is repeatedly opened and closed.

The wave gate may preferably be provided in pairs at the positions adjacent to the gas gates 810 and 813 shown in FIG. 8, and also be provided in a pair at the positions adjacent to the gas gates 811 and 812. That is, the former gates are provided in order to exchange web rolls, and the latter gates to take maintenance care of the inside of the i-type layer forming chamber.

In this instance, films are formed at a low rate in the first doped layer forming chamber and second doped layer forming chamber and at a high rate in the i-type layer forming chamber, and hence the maintenance care of the i-type layer forming chamber is more frequently taken so that the time efficiency of the apparatus 800 as a whole can be improved.

In the apparatus shown in FIG. 8, one end of the web 834 is fixed to the wind-up bobbin 835, and the web is transported by driving the wind-up bobbin 835 through means provided outside the wind-up bobbin chamber 804.

The tension of the web 834 is produced by causing a force reverse to the transport direction to act on the wind-off bobbin 833. As means therefor, the force may be caused to act through a clutch provided outside the wind-off bobbin chamber 801. As the clutch, a powder clutch is preferred.

The gas gate and the temperature control mechanism will be described with reference to FIG. 11.

Figure 11:
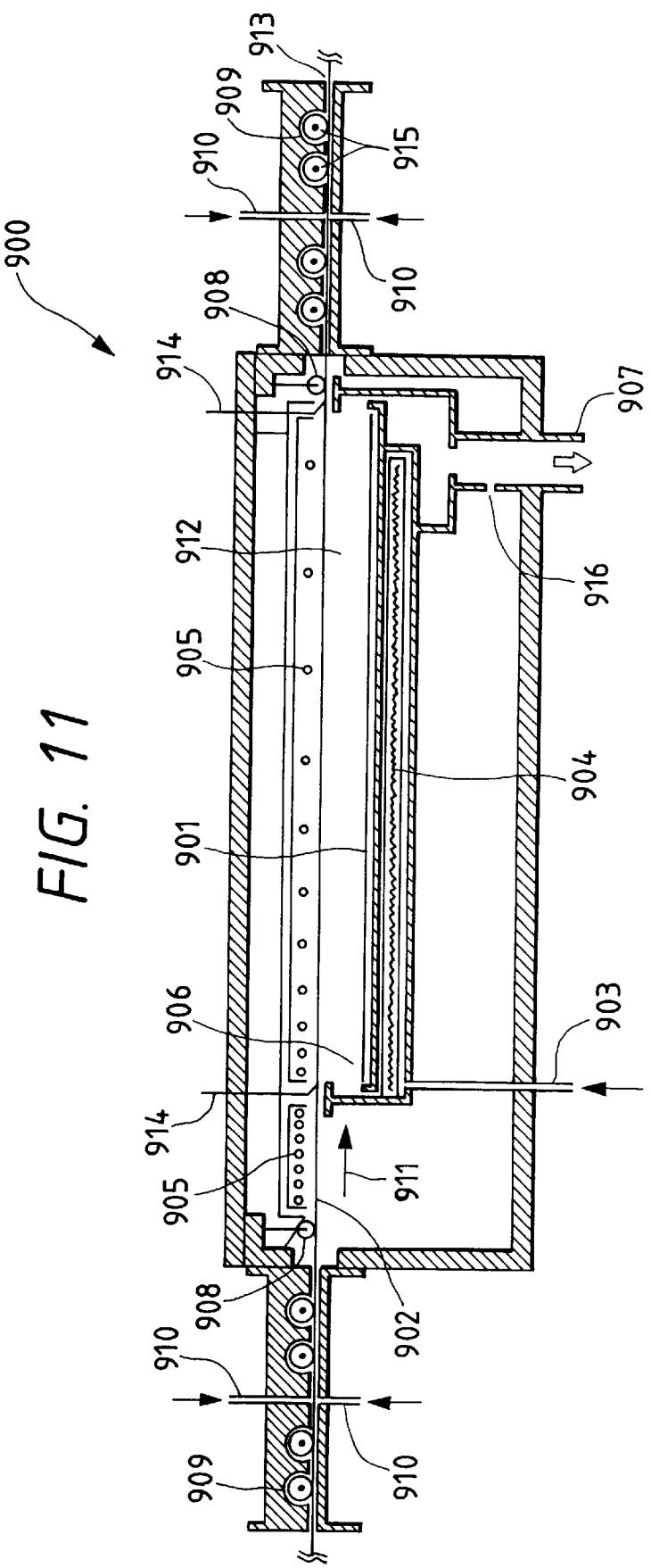
FIG. 11 is a diagrammatic cross-sectional view to illustrate an example of a film forming chamber.

FIG. 11 is a diagrammatic cross-sectional view to illustrate an example of the inside of the first and second doped layer forming chambers 802 and 803 each as shown in FIG. 8.

In FIG. 11, reference numeral 900 denotes a doped layer forming chamber; 901, a high-frequency electrode; 902, a web; 903, a gas feed pipe; 904, a gas heater; 905, a lamp heater; 906, a gas blow outlet; 907, a exhaust duct; 908, a magnet roller; 909, a gas gate; 910, a gate gas feed pipe; 911, web transport direction; 912, a discharge space; 913, a separation passageway; 914, a thermocouple; 915, gate rollers; and 916, a gate gas exhaust duct.

To the high-frequency electrode 901 in the doped layer forming chamber 900, the high-frequency power source 849 having a frequency of 13.56 MHz or 100 kHz is electrically connected as described with reference to FIG. 8, and the high-frequency power is supplied thereto. Of course, this frequency may be changed as occasion calls.

The material gases are passed through the gas feed pipe 903 and flowed beneath the gas heater 904 toward the right as viewed in the drawing. Next, the material gases are flowed over the gas heater toward the left as viewed in the drawing, and are preheated.

Then, the material gases are blown out through the gas blow outlet 906, and flow inside the film forming chamber 912 toward the right as viewed in the drawing, the chamber being surrounded by the high-frequency electrode 901 and the web 902. Then the gases flow downward from the right end of the discharge space 912 and exhausted outside the doped layer forming chamber 900 by means of a vacuum pump through the exhaust duct 907.

In the apparatus shown in FIG. 8, the web 834 is passed through the gas gates 810 to 813, and magnetically attracted by the magnet rollers 836 to 848 so as to be hung down. In the region shown in FIG. 11, the web is passed through the gas gate 909 in such a state that it is passed through the discharge space 912 and is again hung down with the magnet roller 908. Then, the web is transported through the transport path as shown in FIG. 8.

Of all the magnet rollers 836 to 848, the magnet rollers 838, 841 to 843 and 846 provided over the top of the discharge boxes 851 to 853, respectively, each employ the bobbin type magnet roller according to the present invention.

The action of the magnet roller according to the present invention operates will be described with reference to FIG. 7.

As shown in FIG. 7, the web 104 cooled to room temperature by the gas gate (not shown) is transported into the film forming chamber in the state that its transverse sectional shape is substantially flat. Next, before the web enters into the discharge space 102, it is heated to a desired temperature. Because of its thermal expansion at this time, the web spontaneously deforms into irregular waves whose transverse sectional shape varies every moment, to cause scratches on the film forming surface and a decrease in yield and also make discharge stability poor.

Now, the barrel type magnet roller 106 is provided on the inlet side and outlet side of the discharge space 102 so that the transverse sectional shape of the web 104 is forcedly curved to form an upward convex, oval curve to thereby maintain a constant shape free of any changes occurring every moment. At the same time, the discharge box 102 is upward convexly curved in its external shape of the top, and its top opening is made to have an upward convex, curved surface so as to be fit along the curved web 104. Thus, the gap between the web and the discharge box opening can be made narrower, whereby the plasma can be enclosed at a high proportion to bring about an improvement in discharge stability.

At this stage, the web is also more elongated on the film forming surface side than the film forming back side, and hence the thin film formed thereon tends to be compressed when, e.g., the web 104 is cooled to room temperature to return to substantially a flat state after film formation has been completed through the discharge space. Accordingly, the convexly curved, barrel type roller, used when the web 104 has a smaller expansion coefficient than the thin film, can decrease the stress applied to the thin film, and can be expected to bring about an advantage that the film separation occurs less. Also, the concavely curved, bobbin type roller, used when the web has reversely a larger expansion coefficient than the thin film, can be expected to bring about a similar advantage.

The web 104 having come out of the discharge space 102 is naturally cooled by heat dissipation or forcedly cooled by a cooling roller additionally provided, so that the transverse sectional shape of the web 104 returns to substantially a plane, and the web is further transported in that state.

The position and number of the bobbin type magnet roller 106 are not limited to what has been described above, and may be appropriately adjusted according to uses.

In the present example, the gas gate has both the function of gas separation and the function as a passageway for the web.

The function of gas separation can be achieved in the following way: Adjoining film forming chambers are connected through a slit-shaped separation passageway, and a separating gas (gate gas) is flowed in the separation passageway so as to strike against the material gases, to thereby shorten the diffusion length of the material gases.

This will be described in detail with reference to FIG. 11.

The web 902 is passed through a separation passageway 913 of the gas gate 909. The web is transported in the state that the top surface of the web 902 is brought into close contact with gate rollers 915 each having a plurality of grooves internally provided with a permanent magnet and the back surface of the web 902 serving as the film forming surface is in non-contact. The gate gas is fed through the gate gas feed pipe 910 into the separation passageway 913 so as to flow toward the upper and the lower surfaces of the web.

In this instance, the flow rate of the gate gas may preferably be designed taking account of the pressure difference of film forming chambers adjacent to the feed pipe, the inner size of the gas gate, the mutual diffusion coefficient of the separating gas and material gas, the tolerance of mutual diffusion, the maximum quantity of gas exhaust and so forth.

As the gate gas, Ar, He, $H_2$ or the like may be used. The gate gas fed through the gate gas feed pipe 910 is passed through the separation passageway 913 and flows into the film forming chambers adjoining to its both sides. In particular, the gate gas flowing into the doped layer forming chamber is flows into the gas gate exhaust duct 916 provided beneath the discharge space 912 so that it can be prevented from mixing into the discharge space 912.

In the apparatus shown in FIG. 11, in order to improve the performance of gas separation, the inner size of the gas gate 909, i.e., the size of the separation passageway 913 may preferably be as narrow as possible in the thickness direction of the web and as long as possible in the transport direction. On the other hand, in order to prevent the semiconductor layer forming surface from coming in contact with the bottom inner wall of the separation passageway to cause scratches during the transport of the web, the size of the separation passageway may preferably be as wide as possible in the thickness direction of the web and as short as possible in the transport direction.

Taking these two points into consideration, the size of the separation passageway may preferably be set within the range of usually from about 0.3 mm to about 5 mm in the thickness direction of the web, from about 200 mm to about 700 mm in the transport direction and about 20 mm plus web width in the width direction, which must be further taken account of the thickness and transport speed of the web.

Stated specifically, in an instance where the discharge boxes 851 to 853 shown in FIG. 8 has an internal pressure of 1 Torr, $6 \times 10^3$ Torr and 1 Torr, respectively, the film forming chamber 854 having the lowest pressure for forming the i-layer therein requires a severe tolerance of mutual diffusion from the doped layer forming chamber, and hence the size of the separation passageway is set within the range of from about 0.3 mm to about 3 mm in the thickness direction and from about 300 mm to about 700 mm in the transport direction.

On the other hand, at the gas gates provided between the substrate wind-off chamber 801 and the first doped layer forming chamber 802 and between the second doped layer forming chamber 803 and the substrate wind-up chamber 804, having almost no difference in internal pressure, the size of the separation passageway is set within the range of from about 1 mm to about 5 mm in the thickness direction and from about 200 mm to about 500 mm in the transport direction.

Inside the discharge space 912, the web temperature decreases by radiation from the top surface of the web 902 and the web temperature increases by heat coming from plasma. The quantity of radiant heat from the web depends on the surface properties of the web and the residence time of the web in the discharge space 912. The quantity of heat coming from plasma depends on the film forming conditions and the residence time of the web in the discharge space 912. Thus, the temperature of the web 902 changes while it is passed through the discharge space 912. Accordingly, the web temperature may be appropriately controlled by sparsely arranging lamps closer to the outlet of the discharge space 912 or by additionally providing a cooling means.

In the apparatus shown in FIG. 8, it is preferable to correct a positional shift of the web 834 in the direction falling at right angles with the transport direction, which may occur during transport and is corrected so that the web 834 can be wound up on the wind-up bobbin 835 in the state the end of the web 834 is in order.

In the present invention, the substrate wind-up chamber 804 may preferably be provided therein with a lateral shift detecting mechanism and a steering mechanism for correcting the lateral shift.

Figure 12:
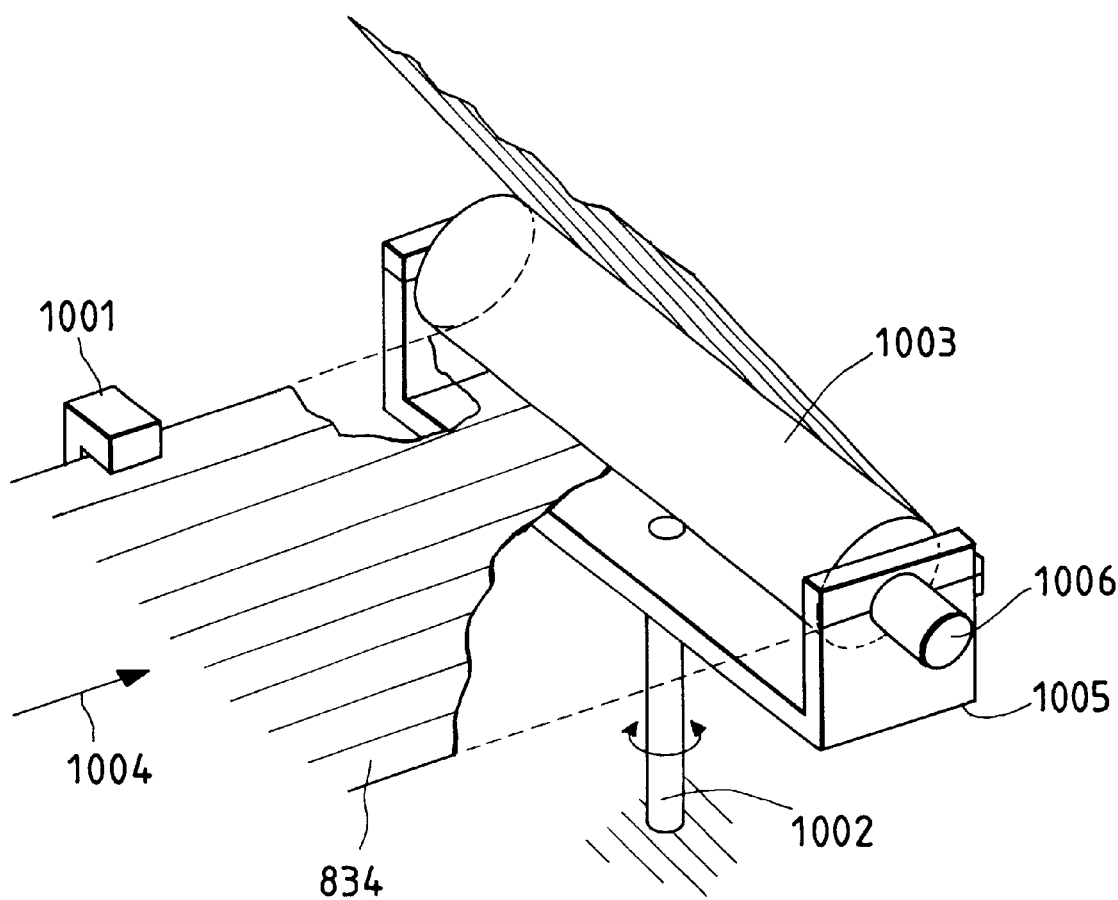
FIG. 12 is a diagrammatic perspective view to illustrate an example of a steering mechanism.

FIG. 12 is a sketch showing examples of the lateral shift detecting mechanism and steering mechanism. In FIG. 12, to make it easy to understand, the web 834 is partly broken to make illustration. FIG. 12 shows an instance where the web is deformed in waves.

In FIG. 12, reference numeral 1001 denotes the lateral shift detecting mechanism; 1002, a rotating mechanism; 1003, a roller; 1004, web transport direction; 1005, a bearing; and 1006, a transport speed detecting encoder.

The web 834 is upward curved at the roller 1003 to change its transport direction 1004. The roller 1003 is set rotatable within horizontal plane by means of the rotating mechanism 1002 via the bearing 1005. Here, the steering mechanism has the roller 1003, the bearing 1005 and a rotating mechanism 1002. This rotating mechanism 1002 is connected to a motor (not shown) via a speed reducer (not shown) so that the rotational angle can be controlled from the outside of the substrate wind-up chamber 804.

The function of the steering mechanism in the case where the web 834 shifts to the left side as viewed in the drawing will be described.

First, the wind-up bobbin 835, the rotating shaft 1002 and the bearing 1005 are positionally adjusted in advance so that the same tension is applied to the right and left of the roller 1003 and the web 834 is wound up on the wind-up bobbin 835 in order. At the position thus adjusted, the amount of lateral shift of the lateral shift detecting mechanism is regarded as 0, and the rotational angle θ of the rotating shaft 1002, as 0°.

Next, when the web shifts to the left side, the amount of shift is detected by the lateral shift detecting mechanism 1001. The rotating mechanism 1002 is also rotated in such a way that the left side of the roller 1003 moves toward the back side and the right side of the roller 1003 towards the front side with respect to the transport direction 1004, i.e., moves clockwise.

With this rotation, the tension becomes strong on the left side of the roller 1003 and becomes weak on the right side thereof, so that the web 834 gradually returns to the right side of the roller 1003 where the tension is weak. When finally the amount of lateral shift is 0, the rotational angle θ is 0, as so controlled.

In order to make all the above movement smooth, it is preferable to provide a feed back mechanism so that the amount of lateral shift and the rotational angle are compared at any time to make adjustment.

In the mechanism shown in FIG. 12, the lateral shift detecting mechanism 1001 is provided at least at one end of the web 834 in its width direction.

The lateral shift detecting mechanism 1001 may preferably be provided inside the substrate wind-up chamber 804 and set as close as possible to the roller 103. When, however, the roller 1003 and the lateral shift detecting mechanism are provided at a distance inevitably, any lowering of sensitivity and delay of response caused by such distance may be compensated by software.

The mechanism constituted in this way makes it possible to achieve a high-speed response when the web is transported at a wide transport speed range of from 0.2 to 5 m/min. as measured by means of the transport speed detecting encoder 1006, and to wind up the web in order.

An example of a process for producing a photovoltaic device by using the plasma-assisted CVD 800 of a roll-to-roll system of the present invention, shown in FIG. 8, will be described below in the order of steps shown below as Step 1 to Step 11.

Step 1:

Step 1 is the step of setting a web having been cleaned in a predetermined manner. In this Step 1, the web wound around the wind-off bobbin 833 is set to a predetermined position. While winding off the web from the wind-off bobbin 833, the gas gate 810, first doped layer forming chamber 802, gas gate 811, i-type layer forming chamber 854, gas gate 812, second doped layer forming chamber 803 and gas gate 813 are all opened at the respective top covers thereof, and the web is passed through these in this order. Then, the leading end of the web is fixed to the wind-up bobbin 835 to make ready so that the web can be wound up on the wind-up bobbin 835.

At this stage, the magnet rollers 836 to 848 are checked to make sure that all of them come into contact with the non-film-forming surface of the web.

Step 2:

Step 2 is the step of transporting the web in the atmosphere, making sure of the transport and stopping the transport. In this Step 2, after the setting of the web has been completed, web driving means such as a wind-up bobbin rotating mechanism (not shown) and a supporting transport roller driving mechanism (not shown) are checked to make sure that the web is continuously transported without difficulties by that means in the atmosphere.

In this step, the web driving means may preferably have both the function of forward movement and the function of backward movement, and also may preferably have an indicator of web wind-off quantity.

After it has been made sure that the web can be transported without difficulties, the web is returned to the initial setting position while monitoring the web wind-off quantity indicator, and is stopped at that position.

Step 3:

Step 3 is the step of evacuating the insides of the film forming chambers having therein the web and transport means. In this Step 3, the respective film forming chambers having therein the web and transport means are closed at their top covers, and the insides of the respective film forming chambers are evacuated by means of vacuum pumps.

In particular, with regard to the i-type layer forming chamber 854, its inside is roughly evacuated to nearly $10^{-3}$ Torr by means of a rotary pump and a mechanical booster pump, and thereafter fully evacuated by means of an oil diffusion pump. Taking this procedure, its inside is continuously evacuated until the pressure inside the discharge box reaches $6 \times 10^{-6}$ Torr.

Step 4:

Step 4 is the step of feeding material gases into the discharge box. In this Step 4, gases are led to a mixing panel (not shown) from gas cylinders (not shown) through a stainless steel pipe (not shown), the mixing panel being a means by which gases are mixed and gas flow rates are precisely controlled. The material gases controlled at predetermined flow rates by a mass flow controller (not shown) provided in the mixing panel are fed into the discharge boxes 851 to 853 through the gas feed pipes 821 to 823. At this stage, the evacuation capacity of the vacuum pumps and the exhaust conductance of the exhaust pipes are previously selected so that the internal pressure of the discharge boxes 851 to 853 each is kept at a predetermined value.

Step 5:

Step 5 is the step of controlling temperature of the web. In this Step 5, the web is controlled to a predetermined temperature by means of a temperature control means (not shown) while flowing material gases.

In this step, since microwave plasma-assisted CVD apparatus has a higher electron density and a higher electron temperature than RF plasma-assisted CVD apparatus, the web temperature tends to rise because of heat coming from plasma.

Equilibrium temperature of the web depends on the microwave power to be applied in the state that the temperature control mechanism is not operated. For example, the equilibrium temperature under conditions as shown in Table 2 is as shown in Table 3.

TABLE 2

| | |
|---|---|
| Web material: | SUS 430 BA (bright annealed) |
| Film forming chamber size: | 13.4 (D) × 14 (H) × 40 (W) cm |
| Film forming conditions: | |
| Material gas flow rate: | SiH$_4$, 99 sccm |
| Pressure: | $(10 \pm 1) \times 10^{-3}$ Torr |
| Bias voltage: | RF 1,500 W |
| Bias current: | about 3.0 A |

TABLE 3

| | |
|---|---|
| Microwave power: | 140 W × 2 |
| Web equilibrium temperature: | 270° C. |

When a desired temperature is different from the equilibrium temperature shown in FIG. 3, the above temperature control mechanism is operated to control the temperature to the desired value.

Hence, also when there are difference in conditions such as materials and surface treatment of web, size of discharge box, gas flow rate, gas mixing ratio, internal pressure of discharge box, bias voltage, microwave and electric power, the web temperature can be controlled to a predetermined value by similarly measuring the equilibrium temperature and optimizing the performance of the temperature control mechanism.

Step 6:

Step 6 is the step of discharging high frequency (film forming step 1). In this Step 6, high-frequency waves are oscillated from an RF power source or microwave power source to apply an RF power or microwave power into the discharge boxes 851 to 853 through coaxial cables or waveguides. Then, the material gases fed inside the discharge boxes 851 to 853 are ionized with the electric power. By the action of the resulting radicals, uniform deposited films are formed on the web at its portions corresponding to the insides of the discharge boxes 851 to 853.

In either case where the RF power or microwave power is used, the power is controlled by a tuner so that reflected power is not more than 20% of incident power in the ionized state.

An RF voltage is applied to bias electrodes (not shown).

Step 7:

Step 7 is the step of transporting the web (film forming step 2). In this Step 7, the web is transported in order to continuously form the deposited films on the web, after the plasma emission produced by the discharging in the above Step 6 and the bias currents have become stable. The web transport speed depends on desired thickness of each deposited film, deposition rate and residence time in film forming chambers. For example, in an instance where the desired thickness of a deposited film is 500 Å and the deposition rate is 40 Å/min., residence time t is $$t=500\text{Å}/40(\text{Å/sec})=12.5(\text{sec}).$$

Therefore, in an instance where a film is formed in one discharge box of 200 mm wide in the transport direction, e.g., the discharge box shown in FIG. 6, transport speed V1 is $$V1=134(\text{mm})/12.5(\text{sec})=10.72(\text{mm/sec})=0.64(\text{m/min}).$$

Step 8:

Step 8 is the step of cooling the web and stopping its transport. In this Step 8, the web transport, high-frequency discharge and temperature control are stopped after the deposited films are continuously formed while transporting the web as previously described and the web wound around the wind-off bobbin has almost run short.

In this step, as means for detecting the residue of the web wound around the wind-off bobbin, the web wind-off length detector previously described or a detector of wind-off bobbin external diameter may be used.

In order to take out the web on which the deposited films have been formed, to put them in the atmosphere, the web must be cooled in advance.

In order to prevent the deposited films from causing layer separation due to this cooling, the web may preferably be gradually cooled, and the material gases are kept flowing for a while after the high-frequency discharging is stopped.

Step 9:

Step 9 is the step of stopping feed of the material gases. In this Step 9, the material gases flow for about 5 minutes and thereafter the feeding of the material gases are stopped. Then, an inert gas (He gas) is flowed at a flow rate of about 200 sccm.

At the time the web temperature becomes about 70° C., the feeding of the inert gas is stopped, and thereafter the remaining gas is exhausted. Then, the discharge boxes 851 to 853 are evacuated until their internal pressure reaches $2 \times 10^{-5}$ Torr.

Step 10:

Step 10 is the step of leaking nitrogen in the film forming chambers. In this Step 10, in order to return the internal pressure of the discharge boxes 851 to 853 to atmospheric pressure from $2 \times 10^{-5}$ Torr, dry nitrogen is fed into the discharge boxes. After a Bourdon tube gauge (not shown) is read to make sure that the pressure of the discharge boxes has returned to atmospheric pressure, the film forming chambers 802 and 803 are opened at the covers thereof, the web on which the deposited films have been formed is taken out of the chambers to put the web in the atmosphere.

Step 11:

Step 11 is the step of taking out the web. In this Step 11, the following two ways are generally available to take out the web.

(a) A web corresponding to one roll is all wound up on the wind-up bobbin until the wind-off bobbin becomes empty, and thereafter the wind-up bobbin and the wind-off bobbin are taken out.

(b) When the web still remains on the wind-off bobbin, it is cut at a position near the wind-off bobbin, and the wind-off bobbin is changed for a wind-off bobbin around which a new web is wound. Then the leading end of the new web is joined to the cut end of the remaining web. Next, the new web is transported until the jointed part comes near to the wind-up bobbin, and thereafter the web is cut at the jointed part. After the jointed part is cut, the wind-up bobbin on which the web having films formed thereon has been wound up is taken out, and a new wind-up bobbin is set in.

Which method of these two ways should be used depends on the length of apparatus or the number of film forming chambers, and may be appropriately selected.

The above procedure enables stable formation of large-area photovoltaic devices.

Results of experiments made in accordance with the present examples will be reported below by giving specific numerical data.

Experiments were made using the plasma-assisted CVD apparatus of a roll-to-roll system as shown in FIG. 8, in the case where the bobbin type magnet roller was used as the magnet roller set in the i-type layer forming chamber 854 (Test Example) and the case where the conventional cylinder type magnet roller was used (Comparative Example). The apparatus of Test Example had the constitution corresponding to that of FIG. 6, and the apparatus of Comparative Example had the constitution corresponding to that of FIG. 2.

The experiments were made in the following way: The plasma-assisted CVD apparatus of a roll-to-roll system as shown in FIG. 8 was continuously operated to produce a-Si (amorphous silicon) cells on a continuous web on which a back reflective layer was already formed. On the cells, transparent electrode films and collector electrodes were formed by vacuum deposition to obtain photovoltaic devices. The devices obtained were then irradiated with artificial sunlight to evaluate their photoelectric conversion efficiency.

Production conditions common to Test Example and Comparative Example are shown in Table 4.

TABLE 4

Substrate (web):

SUS430BA; width: 300 mm; thickness: 0.2 mm; length: 360 m; transport speed: 60 cm/min;

TABLE 4-continued transport time: 10 hrs
Reflecting layer:

Silver (Ag), 100 nm thin film
Reflection enhancing layer:

Zinc oxide (ZnO), 1 µm thin film
Gate gas:

$H_2$ from each gate, 500 cc/min.

Layer forming conditions:

| Layers | Flow rate of gases used (cc/min) | Disdharge power (W) | Pressure (Torr) | Substrate temp. (° C.) |
|---|---|---|---|---|
| n-Type layer: (1st doped layer) | | | | |
| $SiH_4$ | 100 | | | |
| $PH3/H_2$ (1% diluted) | 500 | 100 (RF) | 1.0 | 270 |
| $H_2$ | 700 | | | |
| i-Type layer: | | | | |
| $SiH_4$ | 50 | 200 (microwave) | | |
| $H_2$ | 200 | 500 (RF) | 0.02 | 360 |
| p-Type layer: (2nd doped layer) | | | | |
| $SiH_4$ | 10 | | | |
| $BF3/H_2$ (1% diluted) | 50 | | | 150 |
| $H_2$ | 1,000 | 1,000 (RF) | 1.0 | |

Transparent electrode: $ITO(In_2O_3 + SnO_2)$, 100 nm thin film
Collector electrode: aluminum (Al), 2 µm thin film Next, the yield and characteristics of the photovoltaic devices obtained were evaluated by the method described below.

As factors to cause a decrease in yield during film formation, the following two points are considered.

In the first place, the films are formed while transporting the web of 360 m long at a speed of 60 cm/min., and hence the apparatus is driven for 10 hours as continuous operation time. During the continuous operation, the microwave plasma discharge may become extinguished in some cases, and the web transported before the discharge again takes place comes to have faulty portions. This is one factor to cause a decrease in yield.

The other factor is what is called the shunt, in which scratches or dust occurring on the film forming surface cause a short circuit of cells.

To evaluate the yield of the cells produced, the faulty portions of films caused when plasma discharge became extinguished and the shunt portions of cells caused by scratches or dust occurring on the film forming surface were regarded as defective portions, and the yield of non-defective portions with respect to the full web length was calculated.

In Comparative Example, the value of the clearance 313 shown in FIG. 2 greatly affects the yield, and hence experimental data were obtained in respect of an instance where the value of the clearance is large (Comparative Example 1) and an instance where it is small (Comparative Example 2).

Characteristics of a-Si cells respectively produced in Test Example and Comparative Example under the common conditions as shown in Table 4 were evaluated by measuring photoelectric conversion efficiency obtained when cells with an area of 0.25 $cm^2$ were irradiated with artificial sunlight having an AM value of 1.5 and an energy density of 100 $mW/cm^2$.

The photoelectric conversion efficiency is a value obtained by averaging values of efficiency at 20 spots sampled from each web in its full length. Discharge-off times indicate the number of times in which microwave plasma extinguished during 10 hour continuous drive of the apparatus.

The results obtained by the above evaluation are shown in Table 5.

TABLE 5

| | Clearance (mm) | Photoelectric conversion efficiency (%) | Discharge-off times | Yield (%) |
|---|---|---|---|---|
| Test Example: | | | | |
| | 1.5 | 6.0 | 0 | 97 |
| Comparative Example: | | | | |
| 1 | 8.0 | 5.6 | 45 | 30 |
| 2 | 3.0 | 5.8 | 10 | 6 |

As is seen from Table 5, in Comparative Example 1, having a large value of clearance, the deposited films had many defective portions because plasma leaked out of the discharge box to frequently cause discharge-off. In Comparative Example 2, having a small value of clearance, the yield greatly decreased because the web 304 came in contact with the opening adjuster plate 305 to cause the shunt at that portions. On the other hand, in Test Example, almost all the portions were non-defective over the full length of the web.

As described above, in the present invention, the transverse sectional shape of the web transported so as to form a part of the discharge space is brought into a curved shape, whereby the transverse sectional shape of the web can be prevented from varying in time sequence, so that the film forming surface can be made free of scratches to bring about a dramatic improvement in yield. Also, according to the present invention, the shape of the web which forms a part of the discharge space is kept constant, and hence leakage of discharge can be inhibited and a stable state of discharge can be maintained, whereby deposited films having uniform quality and uniform thickness can be continuously formed.

As a matter of course, the roller of the present invention can also be applied in the film forming apparatus as shown in FIG. 1.

The present invention should not be construed to be limited to what has been described above, and can be appropriately modified within the scope of the gist of the present invention.

What is claimed is:

1. A deposited-film forming process comprising continuously transporting a belt substrate in a direction of the length of the substrate wherein said belt forms a part of one or more discharge spaces, and continuously forming a deposited film on the substrate, wherein a transverse sectional shape of the substrate is forced to be a curved shape having at least one point of inflection when viewed in cross-section perpendicular to the direction of transport of the substrate, and the substrate is transported while maintaining the curved shape, said substrate forming a part of the discharge space.

2. The deposited-film forming process according to claim 1, wherein said curved shape is a curve having two or more points of inflection.

3. The deposited-film forming process according to claim 1, wherein said substrate is maintained in a planar shape in a region prior to transport of the substrate to the discharge space.

4. The deposited-film forming process according to claim 3, wherein the region where said substrate is maintained in a planar shape further comprises a gas gate region.

5. The deposited-film forming process according to claim 1, wherein said substrate is transported along the curved surface formed at an inlet or an outlet from the discharge space.

6. The deposited-film forming process according to claim 1, wherein said deposited film is formed by plasma-assisted CVD.

7. The deposited-film forming process according to claim 1, wherein the deposited film formed on said substrate is a semiconductor layer.

8. The deposited-film forming process according to claim 1, wherein said curved shape is formed according to the shape of a substrate transport roller.

9. The deposited-film forming process according to claim 8, wherein said transport roller has a magnetic force.

10. The deposited-film forming process according to claim 1, wherein said substrate is transported while being magnetically attracted with a transport roller having a curved shape.

11. The deposited-film forming process according to claim 1, wherein means for heating the substrate is provided at the front of said discharge space.

12. The deposited-film forming process according to claim 11, wherein said means for heating the substrate is a heater and the density of heaters is higher at the front of said discharge space.

13. The deposited-film forming process according to claim 1, wherein a plurality of discharge spaces is provided.

14. The deposited-film forming process according to claim 1, wherein the transverse sectional shape has two or more points of inflection.

15. The deposited-film forming process according to claim 1, wherein the curved shape is a shape mimicking the shape of the substrate when spontaneously deformed by heat.

16. The deposited-film forming process according to claim 1, wherein after the discharge space is formed by the substrate, the curved shape of the substrate is further deformed to follow a shape of an outlet of a discharge box.

17. The deposited-film forming process according to claim 16, wherein the substrate is further deformed and thereafter maintained in a planar shape to follow the shape of the outlet of the discharge space.

18. The deposited-film forming process according to claim 1, wherein said substrate forced to be a curved shape is deformed from a side of the substrate which does not face the discharge space.

19. A deposited-film forming process comprising continuously transporting a belt substrate in a direction of the length of the substrate wherein said belt forms a part of one or more discharge spaces, and continuously forming a deposited film on the substrate, wherein a transverse sectional shape of the substrate is forced to be a wave shape having more than one peak when viewed in cross-section perpendicular to the direction of transport of the substrate, and the substrate is transported while maintaining the wave shape, said substrate forming a part of the discharge space.

20. The deposited-film forming process according to claim 19, wherein said wave shape is a curve having two or more points of inflection.

21. The deposited-film forming process according to claim 19, wherein said substrate is maintained in a planar shape in a region prior to transport of the substrate to the discharge space.

22. The deposited-film forming process according to claim 21, wherein the region wherein said substrate is maintained in a planar shape further comprises a gas gate region.

23. The deposited-film forming process according to claim 19, wherein said substrate is transported along the curved surface formed at an inlet to the discharge space.

24. The deposited-film forming process according to claim 19, wherein said deposited film is formed by plasma-assisted CVD.

25. The deposited-film forming process according to claim 19, wherein the deposited film formed on said substrate is a semiconductor layer.

26. The deposited-film forming process according to claim 19, wherein said wave shape is formed according to the shape of a substrate transport roller.

27. The deposited-film forming process according to claim 26, wherein said transport roller has a magnetic force.

28. The deposited-film forming process according to claim 19, wherein said substrate is transported while being magnetically attracted with a transport roller having a curved shape.

29. The deposited-film forming process according to claim 19, wherein means for heating the substrate is provided at the front of said discharge space.

30. The deposited-film forming process according to claim 29, wherein said means for heating the substrate is a heater and the density of heaters is higher at the front of said discharge space.

31. The deposited-film forming process according to claim 19, wherein a plurality of discharge spaces is provided.

32. The deposited-film forming process according to claim 19, wherein the wave shape is a shape mimicking the shape of the substrate when spontaneously deformed by heat.

33. The deposited-film forming process according to claim 19, wherein after the discharge space is formed by the substrate, the wave shape of the substrate is further deformed to follow a shape of an outlet of a discharge box.

34. The deposited-film forming process according to claim 33, wherein the substrate is further deformed and thereafter maintained in a planar shape to follow the shape of the outlet of the discharge space.

35. The deposited-film forming process according to claim 19, wherein in the step of deforming the substrate in the wave shape, force is applied to the side of the substrate which does not face the discharge space.

36. A deposited-film forming process comprising continuously transporting a belt substrate in a direction of the length of the substrate wherein said belt forms a part of one or more discharge spaces, and continuously forming a deposited film on the substrate, wherein a transverse sectional shape of the substrate is forced to be a curved shape when viewed in cross section perpendicular to the direction of transport of the substrate and the substrate is transported while maintaining the curved shape, said substrate forming a part of the discharge space, and force is applied to a side of the substrate which does not form the part of the discharge space to maintain a planar shape.

37. The deposited-film forming process according to claim 36, wherein the curved shape has at least one point of inflection.

38. The deposited-film forming process according to claim 36, wherein said curved shape is an upward convex or downward convex oval curve or a curve having two or more points of inflection.

39. The deposited-film forming process according to claim 36, wherein said substrate is maintained in a planar shape in a region prior to transport of the substrate to the discharge space.

40. The deposited-film forming process according to claim 39, wherein the region where said substrate is maintained in a planar shape further comprises a gas gate region.

41. The deposited-film forming process according to claim 36, wherein said substrate is transported along the curved surface formed at an inlet or an outlet from the discharge space.

42. The deposited-film forming process according to claim 36, wherein said deposited film is formed by plasma-assisted CVD.

43. The deposited-film forming process according to claim 36, wherein the deposited film formed on said substrate is a semiconductor layer.

44. The deposited-film forming process according to claim 36, wherein said curved shape has a shape of a substrate transport roller.

45. The deposited-film forming process according to claim 44, wherein said transport roller has a magnetic force.

46. The deposited-film forming process according to claim 36, wherein said substrate is transported while being magnetically attracted with a transport roller having a curved shape.

47. The deposited-film forming process according to claim 36, wherein means for heating the substrate is provided at the front of said discharge space.

48. The deposited-film forming process according to claim 47, wherein said means for heating the substrate is a heater and the density of heaters is higher at the front of said discharge space.

49. The deposited-film forming process according to claim 36, wherein a plurality of discharge spaces is provided.

50. The deposited-film forming process according to claim 36, wherein the transverse sectional shape has two or more points of inflection.

51. The deposited-film forming process according to claim 36, wherein the curved shape is a shape mimicking the shape of the substrate when spontaneously deformed by heat.

52. The deposited-film forming process according to claim 36, wherein after the discharge space is formed by the substrate, the curved shape of the substrate is further deformed to follow a shape of an outlet of a discharge box.

53. The deposited-film forming process according to claim 52, wherein the substrate is further deformed and thereafter maintained in a planar shape to follow the shape of an outlet of the discharge space.

54. The deposited-film forming process according to claim 36, wherein in the step of deforming the substrate in the curved shape, force is applied to the side of the substrate which does not face the discharge space.

55. A deposited-film forming process comprising continuously transporting a belt substrate in a direction of the length of the substrate wherein said belt forms a part of one or more discharge spaces, and continuously forming a deposited film on the substrate, wherein a transverse sectional shape of the substrate is forced to mimic a shape the substrate would become due to thermal expansion, and the substrate is transported while maintaining the shape to form a part of the discharge space.

56. The deposited-film forming process according to claim 55, wherein the shape is a curved shape.

57. The deposited-film forming process according to claim 56, wherein the curved shape has at least one point of inflection.

58. The deposited-film forming process according to claim 55, wherein said curved shape is an upward convex or downward convex oval curve or a curve having two or more points of inflection.

59. The deposited-film forming process according to claim 55, wherein said substrate is kept planar at a region other thin the region where the substrate is transported while bringing its transverse sectional shape into the curved shape.

60. The deposited-film forming process according to claim 59, wherein the region where said substrate is maintained in a planar shape further comprises a gas gate region.

61. The deposited-film forming process according to claim 55, wherein said substrate is transported along the curved surface formed at an inlet to the discharge space.

62. The deposited-film forming process according to claim 55, wherein said deposited film is formed by plasma-assisted CVD.

63. The deposited-film forming process according to claim 55, wherein the deposited film formed on said substrate is a semiconductor layer.

64. The deposited-film forming process according to claim 55, wherein said curved shape is formed according to the shape of a substrate transport roller.

65. The deposited-film forming process according to claim 64, wherein said transport roller has a magnetic force.

66. The deposited-film forming process according to claim 55, wherein said substrate is transported while being magnetically attracted with a transport roller having a curved shape.

67. The deposited-film forming process according to claim 55, wherein means for heating the substrate is provided at the front of said discharge space.

68. The deposited-film forming process according to claim 67, wherein said means for heating the substrate is a heater and the density of heaters is higher at the front of said discharge space.

69. The deposited-film forming process according to claim 55, wherein a plurality of discharge spaces is provided.

70. The deposited-film forming process according to claim 55, wherein the transverse sectional shape has two or more points of inflection.

71. The deposited-film forming process according to claim 55, wherein the shape is a shape mimicking the shape of the substrate when spontaneously deformed by heat.

72. The deposited-film forming process according to claim 55, wherein after the discharge space is formed by the substrate, the shape of the substrate is further deformed to follow a shape of an outlet of a discharge box.

73. The deposited-film forming process according to claim 72, wherein the substrate is further deformed and thereafter maintained in a planar shape to follow the shape of the outlet of the discharge space.

74. The deposited-film forming process according to claim 55, wherein in the step of deforming the substrate to mimic a shape the substrate would become due to thermal expansion, force is applied to a side of the substrate which does not face the discharge space.

75. A deposited-film forming process comprising continuously transporting a belt substrate in a direction of the length of the substrate, wherein said substrate forms a part of one or more discharge spaces, and continuously forming a deposited film on the substrate, wherein a force is applied to a side of the substrate where deposition does not take place to place the substrate into a curved shape having at least one point of inflection when viewed crosswise with respect to the direction of transport of the substrate and the substrate is transported while maintaining the curved shape, said substrate forming a part of the discharge space.

76. The deposited-film forming process according to claim 75, wherein the curved shape has at least two points of inflection.

77. The deposited-film forming process according to claim 75, wherein the side where force is applied opposes the deposited side.

78. The deposited-film forming process according to claim 75, wherein said substrate is maintained in a planar shape in a region prior to transport of the substrate to the discharge space.

79. The deposited-film forming process according to claim 78, wherein the region where said substrate is maintained in a planar shape further comprises a gas gate region.

80. The deposited-film forming process according to claim 75, wherein said substrate is transported along the curved surface formed at an inlet or an outlet from the discharge space.

81. The deposited-film forming process according to claim 75, wherein said deposited film is formed by plasma-assisted CVD.

82. The deposited-film forming process according to claim 75, wherein the deposited film formed on said substrate is a semiconductor layer.

83. The deposited-film forming process according to claim 75, wherein said curved shape is formed according to the shape of a substrate transport roller.

84. The deposited-film forming process according to claim 83, wherein said transport roller has a magnetic force.

85. The deposited-film forming process according to claim 75, wherein said substrate is transported while being magnetically attracted with a transport roller having a curved shape.

86. The deposited-film forming process according to claim 75, wherein means for heating the substrate is provided at the front of said discharge space.

87. The deposited-film forming process according to claim 86, wherein said means for heating the substrate is a heater and the density of heaters is higher at the front of said discharge space.

88. The deposited-film forming process according to claim 75, wherein a plurality of discharge spaces is provided.

89. The deposited-film forming process according to claim 75, wherein the transverse sectional shape has two or more points of inflection.

90. The deposited-film forming process according to claim 75, wherein the curved shape is a shape mimicking the shape of the substrate when spontaneously deformed by heat.

91. The deposited-film forming process according to claim 75, wherein after the discharge space is formed by the substrate the curved shape of the substrate is further deformed to follow a shape of an outlet of a discharge box.

92. The deposited-film forming process according to claim 91, wherein the substrate is further deformed and thereafter maintained in a planar shape to follow the shape of the outlet of the discharge space.

93. The deposited-film forming process according to claim 75, wherein in the step of deforming the substrate in the curved shape, force is applied to the side of the substrate which does not face the discharge space.

* * * * *

UNITED STATES PATENT AND TRADEMARK OFFICE
CERTIFICATE OF CORRECTION

PATENT NO.    : 6,350,489 B1
DATED         : February 26, 2002
INVENTOR(S)   : Moriyama et al.

It is certified that error appears in the above-identified patent and that said Letters Patent is hereby corrected as shown below:

Column 1,
Line 30, "peer" should read -- per --; and
Line 40, "discharge" should read -- discharge are readily available, --.

Column 7,
Table 1, "361.0 min" should read -- 361.0 mm --; and
Table 1, "361.6 min" should read -- 361.6 mm --.

Column 9,
Line 28, "attraction" should read -- attraction can --; and
Line 34, "not" should read -- not have --.

Column 14,
Line 29, "is" should be deleted.

Column 25,
Line 7, "thin" should read -- than --.

Signed and Sealed this

First Day of April, 2003

JAMES E. ROGAN
*Director of the United States Patent and Trademark Office*